(12) United States Patent
Teng

(10) Patent No.: US 8,432,704 B2
(45) Date of Patent: Apr. 30, 2013

(54) CLIP FOR BIOS CHIP

(75) Inventor: Xing-Long Teng, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 195 days.

(21) Appl. No.: 12/979,307

(22) Filed: Dec. 27, 2010

(65) Prior Publication Data
US 2012/0155045 A1  Jun. 21, 2012

(30) Foreign Application Priority Data
Dec. 17, 2010  (CN) .......................... 2010 1 0594357

(51) Int. Cl.
*H05K 7/00* (2006.01)
(52) U.S. Cl.
USPC ............ 361/783; 361/760; 439/912; 439/358

(58) Field of Classification Search .................. 361/783; 439/912, 358, 269.1; 324/762.02
See application file for complete search history.

(56) References Cited

U.S. PATENT DOCUMENTS
4,632,485 A * 12/1986 Brown et al. ................. 439/330
* cited by examiner

*Primary Examiner* — Timothy Thompson
*Assistant Examiner* — Andargie M Aychillhum
(74) *Attorney, Agent, or Firm* — Altis Law Group, Inc.

(57) ABSTRACT

A clip for a basic input/output system (BIOS) chip includes a main body, two spindles, two clipping elements, and two torsion springs. The main body includes a number of connecting pins mounted on a bottom of the main body, and a number of signal pins mounted on a top of the main body and electrically and correspondingly connected to the number of the connecting pins. The clipping elements are rotatably mounted to opposite ends of the main body through the spindles. The torsion springs are mounted between the clipping members and the main body. The connecting pins of the main body respectively electrically contacts a number of chip pins of the BIOS chip in response to the clipping elements clipping the BIOS chip.

5 Claims, 3 Drawing Sheets

CLIP FOR BIOS CHIP

BACKGROUND

1. Technical Field

The present disclosure relates to a clip for clipping a basic input/output system (BIOS) chip to be programmed on a circuit board.

2. Description of Related Art

Nowadays, computers are widely used in many fields. Before shipment, the computers need to be tested. When testing a computer, a BIOS chip needs to be taken off from the motherboard of the computer and programmed. After the BIOS chip is programmed, the BIOS chip is soldered to the motherboard. However, because the BIOS chip needs to be taken off from the motherboard and then soldered back on, it often occurs that the pads of the motherboard and the BISO chip are damaged, reducing test efficiency.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
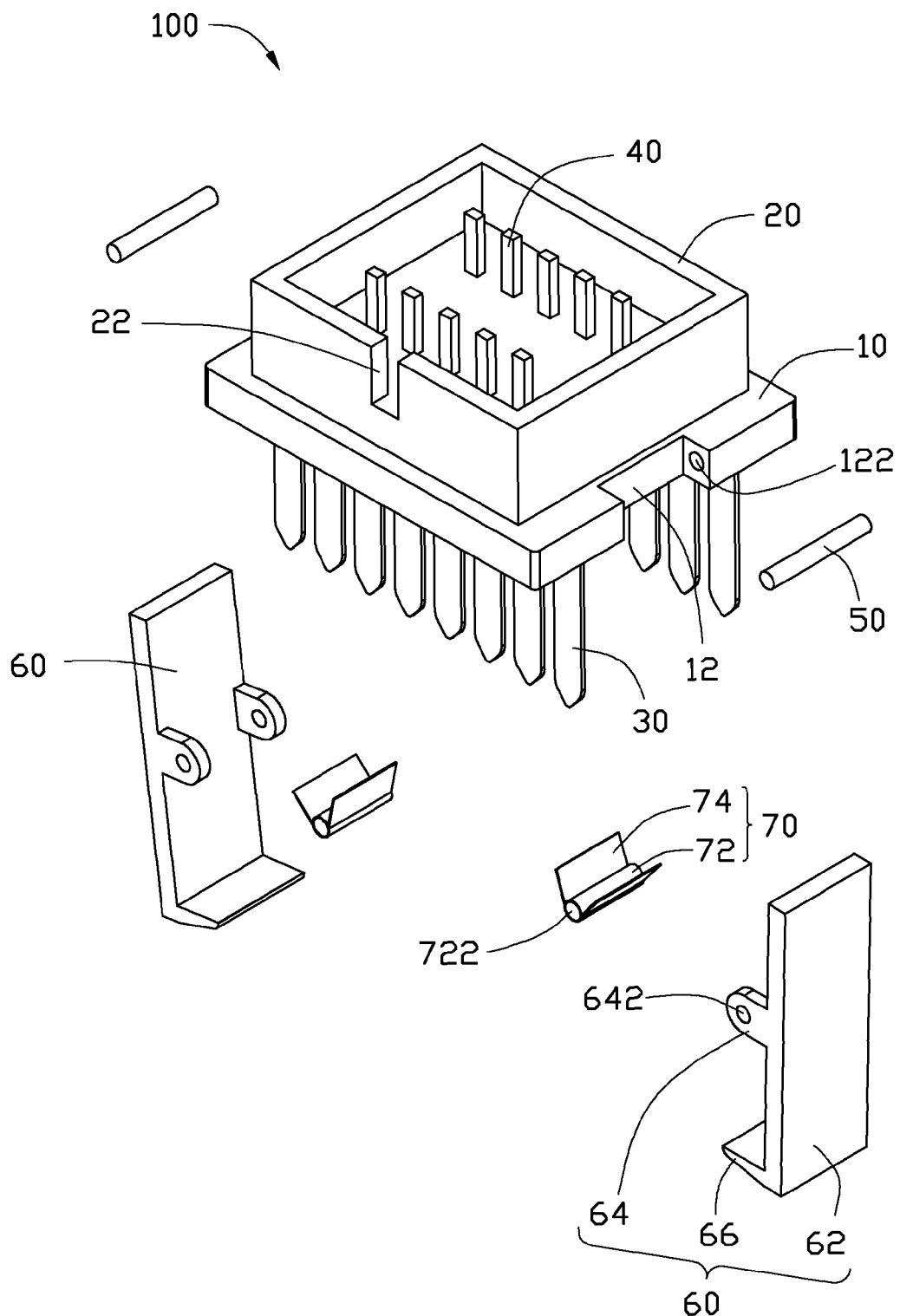
FIG. 1 is an exploded, isometric view of an embodiment of a clip for a basic input/output system (BIOS) chip.
Figure 3:
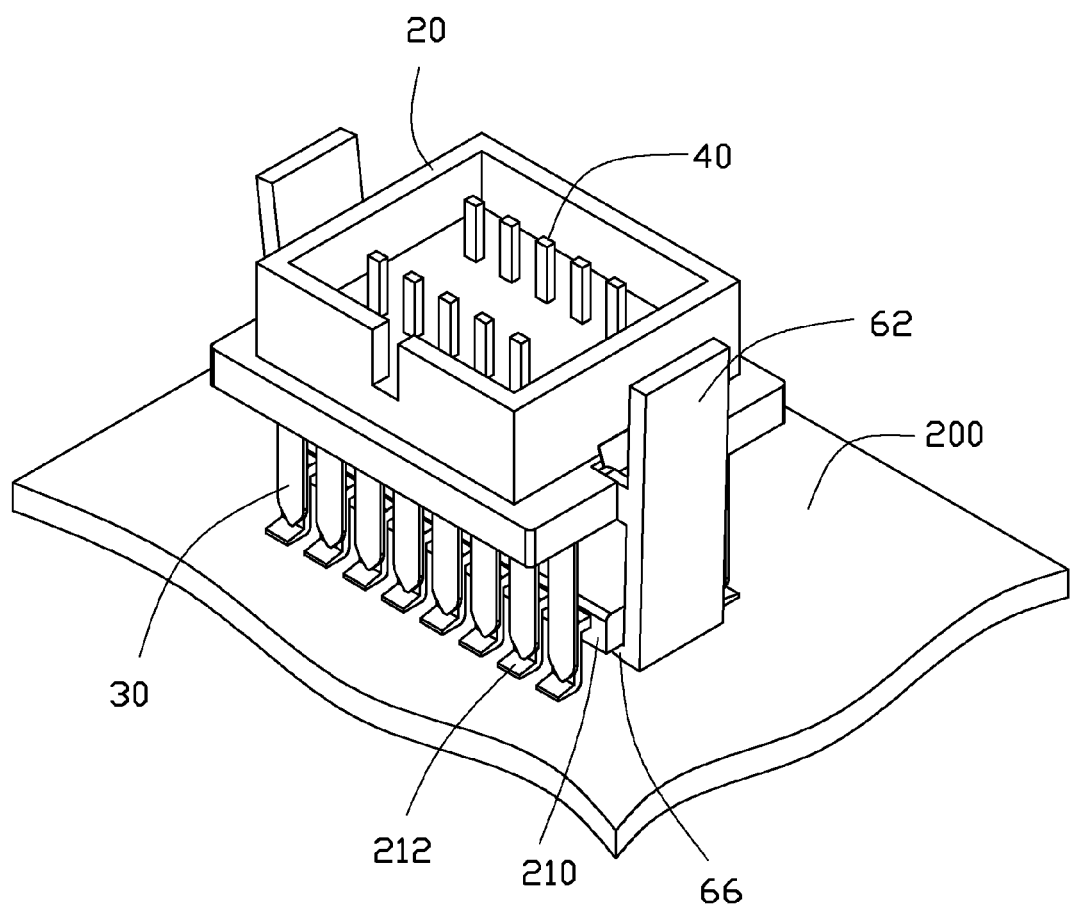
FIG. 3 shows the clip of FIG. 2 in a state of use.

Referring to FIG. 1, an embodiment of a clip 100 is provided to clip a basic input/output system (BIOS) chip 210 to be programmed of a motherboard 200 (see FIG. 3). The clip 100 includes a main body 10, two spindles 50, two clipping elements 60, and two elastic members such as two torsion springs 70.

The main body 10 is substantially rectangular and includes a plurality of signal pins 40 and a plurality of connecting pins 30. The signal pins 40 are perpendicularly mounted on a top of the main body 10 in two rows. The connecting pins 30 are perpendicularly mounted on a bottom of the main body 10 in two rows. The signal pins 40 are respectively electrically connected to the corresponding connecting pins 30, any remaining pins 30 are lift idle. In one embodiment, the number of the signal pins 40 is ten, and the number of the connecting pins 30 is sixteen. In other embodiments, the number of the signal pins 40 and the number of the connecting pins 30 can be adjusted according to requirements. The clip 100 is used together with a programming device (not shown). For being easily connected to the programming device, the main body 10 further includes a receiving frame 20 extending up from sides of the top of the main body 10 and surrounding the signal pins 40, and the receiving frame 20 defines a slot 22 in a middle of a side of the receiving frame 20.

Two opposite ends of the main body 10 each define an opening 12. Two opposite sidewalls bounding each opening 12 each define a rotation hole 122. The main body 10 is made of elastic material, such as a pliable resilient form of plastic. A length of the spindle 50 is a little longer than a length of the opening 12. When the opening 12 is stretched, the spindle 50 can be put in the opening 12. When the opening 12 is restored, opposite ends of the spindle 50 are received in the rotation holes 122, therefore the spindle 50 is rotatably mounted to the ends of the main body 10.

Each clipping element 60 includes a substantially rectangular board 62, two rotating portions 64 substantially perpendicularly extending from middles of opposite sides of the board 62, and a substantially wedge-shaped supporting portion 66 extending from a bottom end of the board 62. Each rotating portion 64 defines a through hole 642 corresponding to the corresponding rotation hole 122 of the main body 10.

Each torsion spring 70 includes a cylinder-shaped elastic portion 72 and two elastic pieces 74 forming an angle therebetween extending from a circumference of the elastic portion 72. A spring hole 722 is axially defined in the elastic portion 72.

Figure 2:
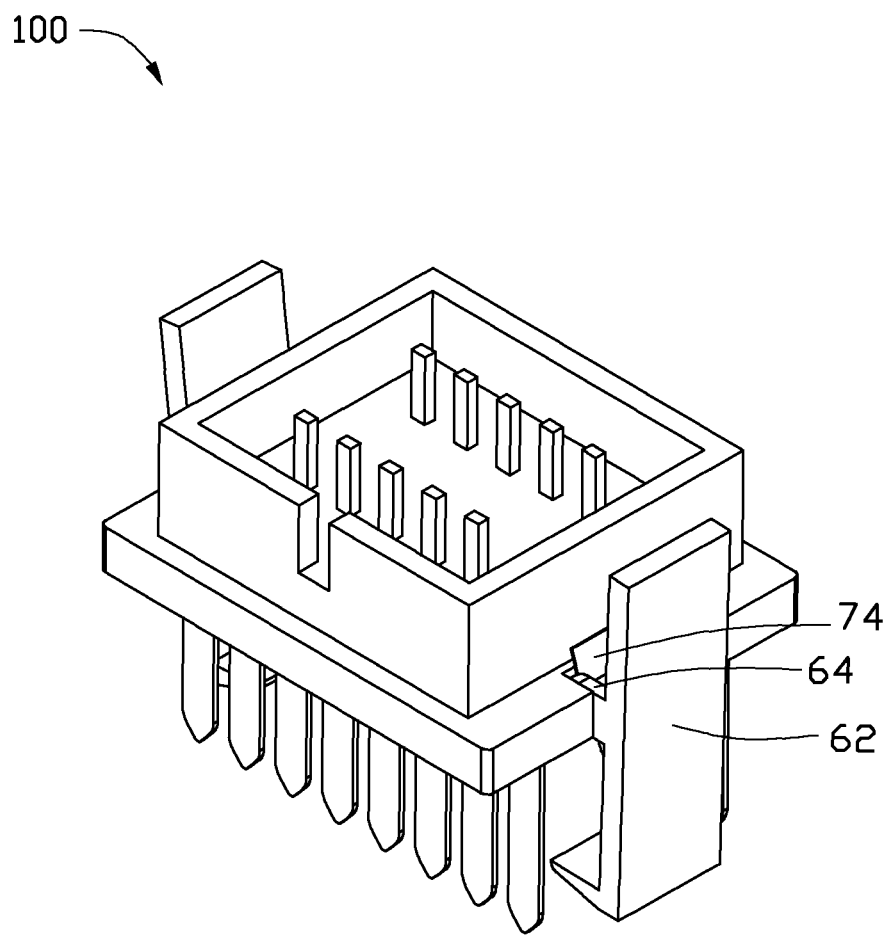
FIG. 2 is an assembled view of FIG. 1.

Referring to FIG. 2, in assembly, each spindle 50 is extended through one of the through holes 642 of a corresponding clipping element 60, the spring hole 722 of a corresponding torsion spring 70, and the other through hole 642 of the corresponding clipping element 60 in that order, and then the spindle 50 is rotatably mounted to the corresponding end of the main body 10. One of the elastic pieces 74 resists against the board 62 of the clipping element 60, and the other elastic piece 74 resists against a sidewall bounding the opening 12 between the rotation holes 122. Therefore, the clipping elements 60 can clip the BIOS chip 210 to the motherboard 200 under force of the torsion springs 70.

Referring to FIG. 3, in use, the clip 100 clips opposite ends of the BIOS chip 210 of the motherboard 200, with the supporting portions 66 of the clipping elements 60 blocked under the chip 210. At this time, the connecting pins 30 of the clip 100 respectively electrically contact chip pins 212 of the BIOS chip 210. After the chip 210 is clipped by the clip 100, the programming device communicates with the signal pins 40 of the clip 100, therefore the programming device can communicate through the corresponding chip pins 212 with the chip 210 through the connecting pins 30 of the clip 100, to program the chip 210, which is very convenient. Furthermore, the chip 210 does not need to be removed from the motherboard 200 and soldered back on the motherboard 200 again during programming and testing, which can protect the chip 210 and the motherboard 200 from damage.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A clip for a basic input/output system (BIOS) chip, the clip comprising:
   a main body comprising a plurality of connecting pins mounted on a bottom of the main body, and a plurality of signal pins mounted on a top of the main body and electrically and correspondingly connected to the plurality of connecting pins;
   two spindles;

two clipping elements rotatably mounted to opposite ends of the main body by the spindles, to clip the BIOS chip; and two elastic members mounted between the clipping elements and the main body to bias the clipping elements to clip the BIOS chip;

wherein the plurality of connecting pins of the main body respectively electrically contacts a plurality of chip pins of the BIOS chip in response to the clipping elements clipping the BIOS chip; and wherein the main body further comprises a receiving frame extending up from sides of the top of the main body and surrounding the plurality of signal pins, and the receiving frame defining a slot in a middle of a side of the receiving frame.

2. The clip of claim 1, wherein the main body is made of elastic material, opposite ends of the main body each define an opening, two opposite sidewalls bounding each opening each define a rotation hole to receive one of opposite ends of a corresponding spindle.

3. The clip of claim 2, wherein each clipping element comprises a substantially rectangular board, two rotating portions substantially perpendicularly extending from middles of opposite sides of the board, each rotating portion defines a through hole for the corresponding spindle extending through.

4. The clip of claim 3, wherein a supporting portion extends from a bottom end of the board of each clipping element, to support the BIOS chip.

5. The clip of claim 1, wherein the two elastic members are torsion springs.

* * * * *